United States Patent

Jong et al.

[11] Patent Number: 6,035,319
[45] Date of Patent: Mar. 7, 2000

[54] PARALLEL-SERIAL MULTIPLIER AND ACCUMULATOR

[75] Inventors: Her-Ming Jong; Gwo-Sheng Huang, both of Hsinchu; Wen-Kuang Su; Chao-Hui Hsu, both of Taipei, all of Taiwan

[73] Assignee: Industrial Technology Research Institute, Taiwan

[21] Appl. No.: 09/146,767

[22] Filed: Sep. 3, 1998

Related U.S. Application Data

[62] Division of application No. 08/912,591, Aug. 18, 1997.

[51] Int. Cl.[7] .................. G06F 7/52; G06F 7/38
[52] U.S. Cl. ................ 708/628; 708/632; 708/523
[58] Field of Search .................. 708/628–632, 708/523, 705

[56] References Cited

U.S. PATENT DOCUMENTS

| | | | |
|---|---|---|---|
| 4,546,446 | 10/1985 | Machida | 708/632 |
| 4,726,036 | 2/1988 | Sawyer et al. | |
| 4,774,686 | 9/1988 | McClary et al. | 708/705 |
| 4,939,685 | 7/1990 | Feintuch | |
| 4,947,362 | 8/1990 | Bui | |
| 5,001,661 | 3/1991 | Corleto et al. | |
| 5,204,831 | 4/1993 | Grazsi et al. | 708/705 |
| 5,226,003 | 7/1993 | Nagamatsu | 708/632 |
| 5,243,624 | 9/1993 | Paik et al. | |
| 5,295,136 | 3/1994 | Ashley et al. | |
| 5,333,149 | 7/1994 | Vicard et al. | |
| 5,416,799 | 5/1995 | Currivan et al. | |
| 5,450,339 | 9/1995 | Chester et al. | |
| 5,524,023 | 6/1996 | Tsujimoto | |
| 5,553,014 | 9/1996 | DeLeón, II et al. | |
| 5,745,396 | 4/1998 | Shanbhag | |

OTHER PUBLICATIONS

Chin–Liang Wang, "Bit–Serial VLSI Implementation of Delayed LMS Adaptive FIR Filters," *IEEE Transactions on Signal Processing*, vol. 42, No. 8, Aug. 1994, 2169–2175.

*Primary Examiner*—Tan V. Mai
*Attorney, Agent, or Firm*—Christensen O'Connor Johnson & Kindness PLLC

[57] ABSTRACT

An improved parallel-serial multiplier and accumulator for multiplying a digital multiplicand and a multiplier resulting in a product that is added to an accumulator input. The parallel-serial multiplier and accumulator includes a parallel-serial multiplier and a digit serial adder. The parallel-serial multiplier includes a recoder for receiving the digital multiplier and outputting an ordered sequence of recoded words, a partial product generator for generating partial products that are dependent upon the digital multiplicand and upon each of the ordered sequence of recoded words, and an adder for adding the partial products to provide the product. The adder outputs a digit serial word that contains the least significant bits of an intermediate sum of the partial products as the partial products are being added. The digit serial adder includes a carry save adder that receives the product and the accumulator input to produce the output sum.

6 Claims, 13 Drawing Sheets

PARALLEL-SERIAL MULTIPLIER AND ACCUMULATOR

RELATED APPLICATIONS

This application is a division of application Ser. No. 08/912,591, filed on Aug. 18, 1997.

FIELD OF THE INVENTION

The present invention relates to least mean square adaptive filters and, more particularly, to a novel pipelined architecture using a modified least mean square algorithm.

BACKGROUND OF THE INVENTION

The least mean square (LMS) adaptive filter algorithm has found many applications in situations where the statistics of the input processes are unknown or changing. These include noise cancellation, line enhancing, and adaptive array processing. The algorithm uses a transversal filter structure driven by a primary input, so as to minimize the mean-square error.

The LMS algorithm is often the algorithm of choice for hardware realization because it solves adaptive filter problems without prior knowledge of higher order statistics of the signal being processed. The LMS algorithm is derived in Chapter 6 of the book entitled "Adaptive Signal Processing," by B. Widrow and S. D. Stearns, Prentice-Hall, Inc. (1985). The prior art transversal filter implementation of the LMS algorithm is a time domain network in which time-spaced samples of a given input signal are weighted and summed to produce as an output signal an idealized replica of the input signal. These applications, however, have invariably used sequential processing or microprocessor control.

An $n^{th}$ order filter that implements the LMS algorithm can be represented by the following equations:

$$y(n) = \sum_{k=0}^{N-1} c_k(n)x(n-k)$$

$$e(n) = g(n) - y(n)$$

$$c_k(n) = c_k(n) + \mu e(n)x(n-k)$$

$$k = 0, 1, \ldots, N-1$$

where $x(n)$ is the filter input at time n; $c_k(n)$ is the kth filter coefficient at time n; $y(n)$ is the filter output; $g(n)$ is the desired response; $e(n)$ is the residual error, and $\mu$ is the step size of coefficient updating.

The LMS algorithm, especially for high-speed applications, has generally been implemented in a transversal manner, as shown in the 5-tap example of FIG. 1. The structure consists of the filter kernel and the error generation and feedback loop. The kernel, included within the dashed line identified by reference 10, consists of the transversal finite impulses response (FIR) portion and the coefficient updating sector. A more complete description of this prior art filter can be found in U.S. Pat. No. 5,450,339 to Chester et al. This prior art transversal LMS implementation has several limitations. For long filter applications, the summation tree formed with the summation block 38 presents latency problems in the filter. For example, the longer the filter (i.e., the higher order of the FIR filter), the more taps in the adaptive filter and the longer the latency becomes through the summation tree. This latency causes delays in the error calculations and eventually can lead to a situation wherein the error calculation occurs after the relevant data sample has exited the filter's state register. Additionally, the summation tree further limits the regularity and modularity of the design which can severely limit integrated circuit implementations by limiting the cascadability of the architecture.

The LMS algorithm can also be implemented by a reconfigurable datapath dedicated for LMS execution, or even by a programmable digital signal processor. The former provides higher efficiency than the latter, however, it is still much slower than those implementations using dedicated parallel hardware. Further, significant hardware overhead is introduced by data switching, storage, and control configurations. FIG. 2 shows a prior art implementation which uses a reconfigurable hardware architecture to execute the LMS algorithm and some other multiplication functions. A more complete description of this prior art filter can be found in U.S. Pat. No. 5,001,661 to Corleto et al.

To overcome the inherent drawbacks of the standard LMS algorithm, modifications to the algorithm have been proposed for the purposes of easier hardware implementation. FIG. 3 shows a prior art architecture which adopts the direct transversal finite impulse response portion of the algorithm while using the delayed version of the updated filter coefficients. The embodiment of FIG. 3 is taken from U.S. Pat. No. 4,726,036 to Sawyer et al. and is more completely described therein. Although the hardware critical path is shortened by the new architecture for the tapped delay line, one main disadvantage is that the summation tree 30 is still present.

Another modification of LMS, called delayed LMS (DLMS), has been recently introduced. The DLMS algorithm was first disclosed in a paper entitled "The LMS Algorithm with Delayed Coefficient Adaptation", by G. Long, G. Ling, and J. G. Proakis, *IEEE Transactions of Acoustices, Speech, and Signal Processing*, vol. 37, No. 9, September 1989. A hardware implementation of the DLMS algorithm is found in "Bit-Serial VLSI Implementation of Delayed LMS Adaptive FIR Filters", by Chin-Ling Wang, *IEEE Transactions On Signal Processing*, vol. 42, No. 8, August 1994. FIGS. 4, 5, and 6 show the data flow graph and two systolic architectures for implementing the delayed LMS algorithm, respectively. Note that in the implementations shown in FIGS. 5 and 6, the summation tree has been removed. Although the implementations shown in FIGS. 5 and 6 of the DLMS algorithm solve to a certain extent the problem of the critical path at hardware computation and providing the desired modularity for easy VLSI implementation, these architectures are not optimized.

SUMMARY OF THE INVENTION

An improved parallel-serial multiplier and accumulator is disclosed. The parallel-serial multiplier and accumulator includes a parallel-serial multiplier and a digit serial adder. The parallel-serial multiplier includes a recoder, a partial product generator, and an adder. The recoder receives a digital multiplier and outputs an ordered sequence of recoded words. Based upon the ordered sequence of recoded words and a digital multiplicand, the partial product generator generates partial products. As the partial products are being added, the adder outputs a digit serial word that contains the least significant bits of an intermediate sum of the partial products. The digit serial adder includes a carry save adder that receives the product and an accumulator input to produce an output sum.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

The present invention discloses a new modification of the LMS algorithm. The modified LMS algorithm exhibits good performance while being amenable to efficient implementation in VLSI structures. The modified LMS algorithm of the present invention is described by the following equations:

$$y(n) = \sum_{k=0}^{N-1} c_k(n-k)x(n-k)$$

$$e(n)=g(n)-y(n)$$

$$C_k(n+1)=C_k(n)+\mu e(n)x(n-k)$$

$$k=0,1,\ldots,N-1$$

where x(n) is the filter input at time n; $c_k(n)$ is the $k^{th}$ filter coefficient at time n; y(n) is the filter output; g(n) is the desired response; e(n) is the residual error, and $\mu$ is the step size of coefficient updating.

Figure 1:
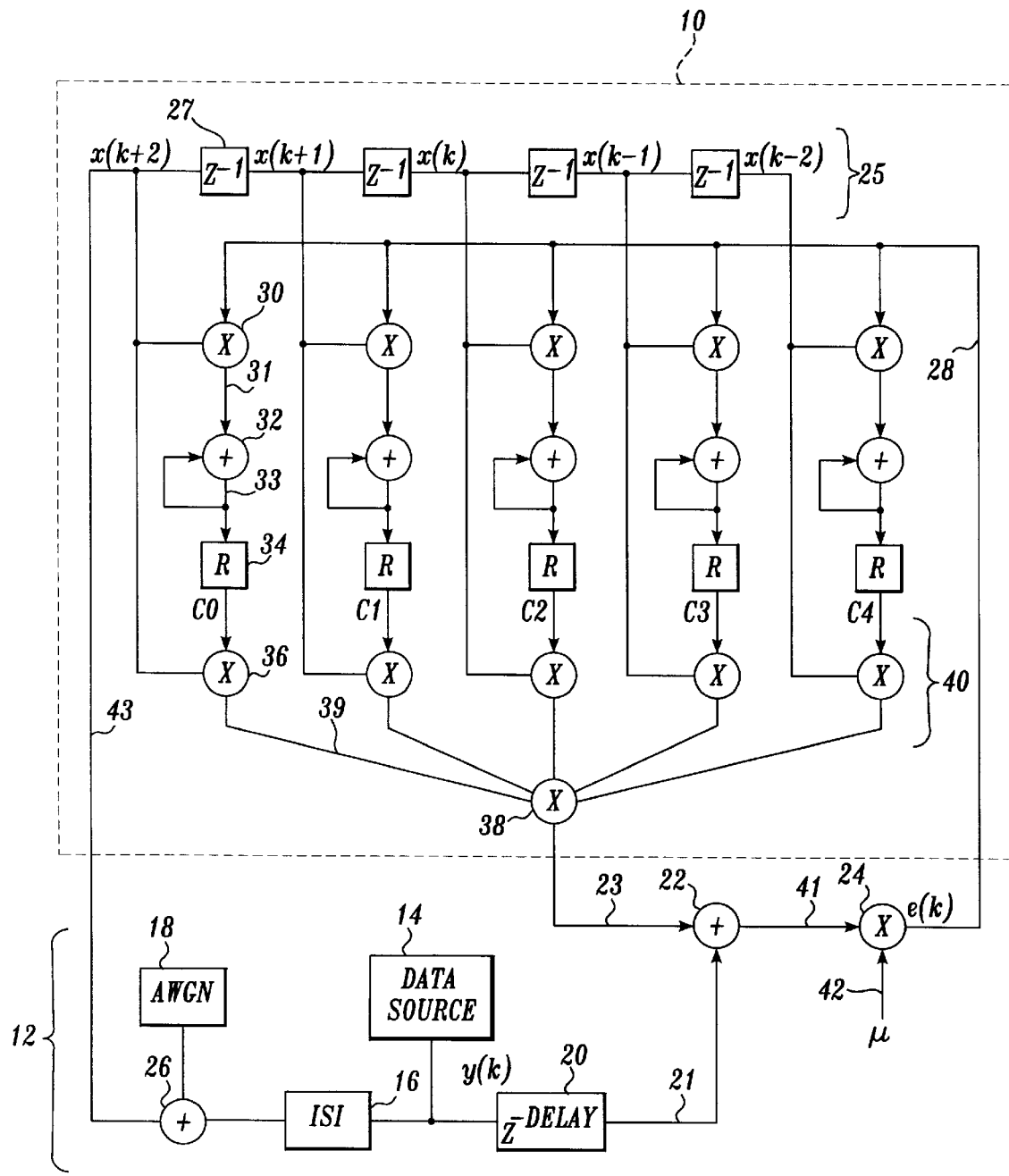
FIGS. 1–6 are prior art implementations of versions of the least mean square adaptive filters.
Figure 2:
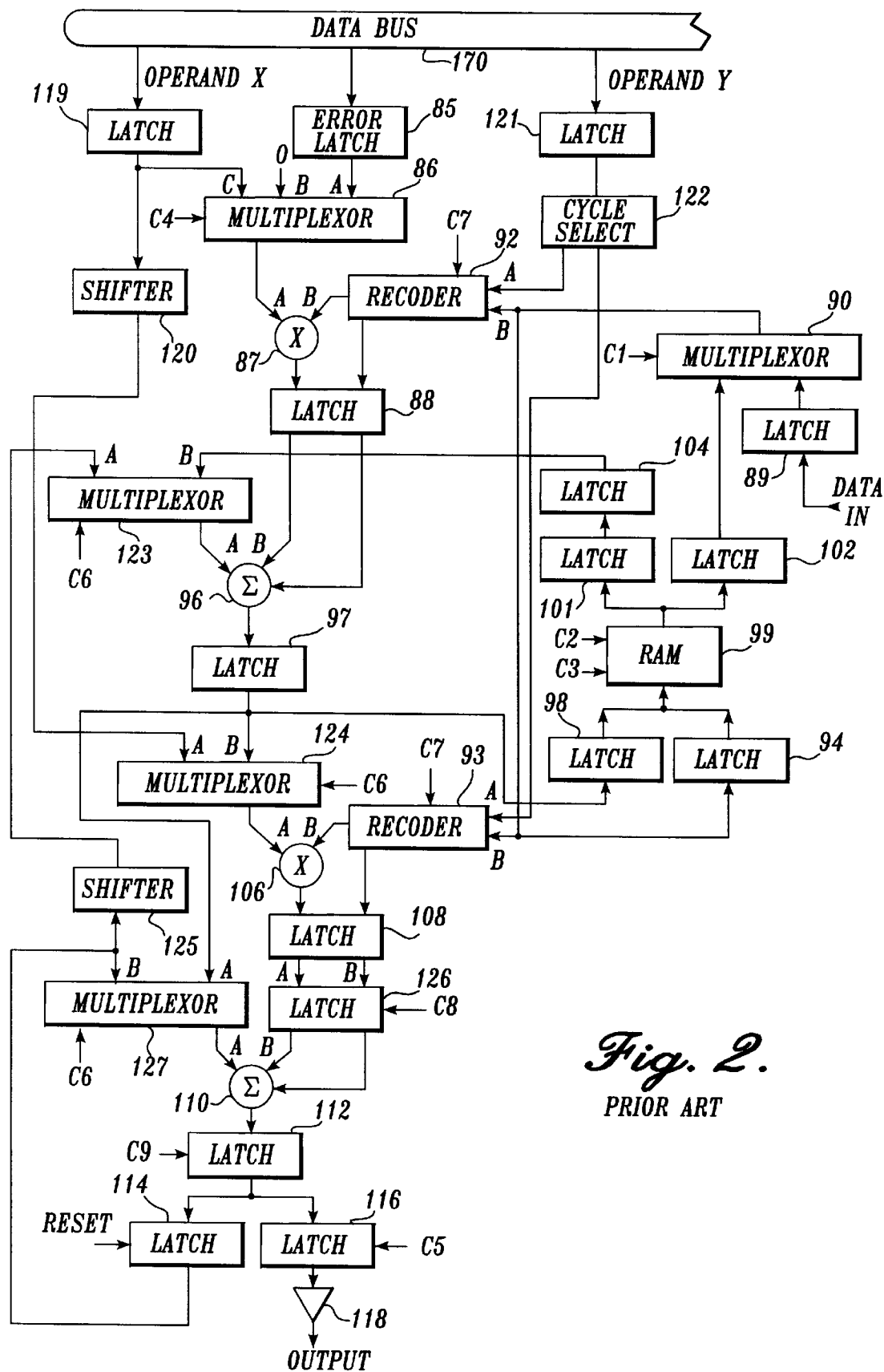
Figure 3:
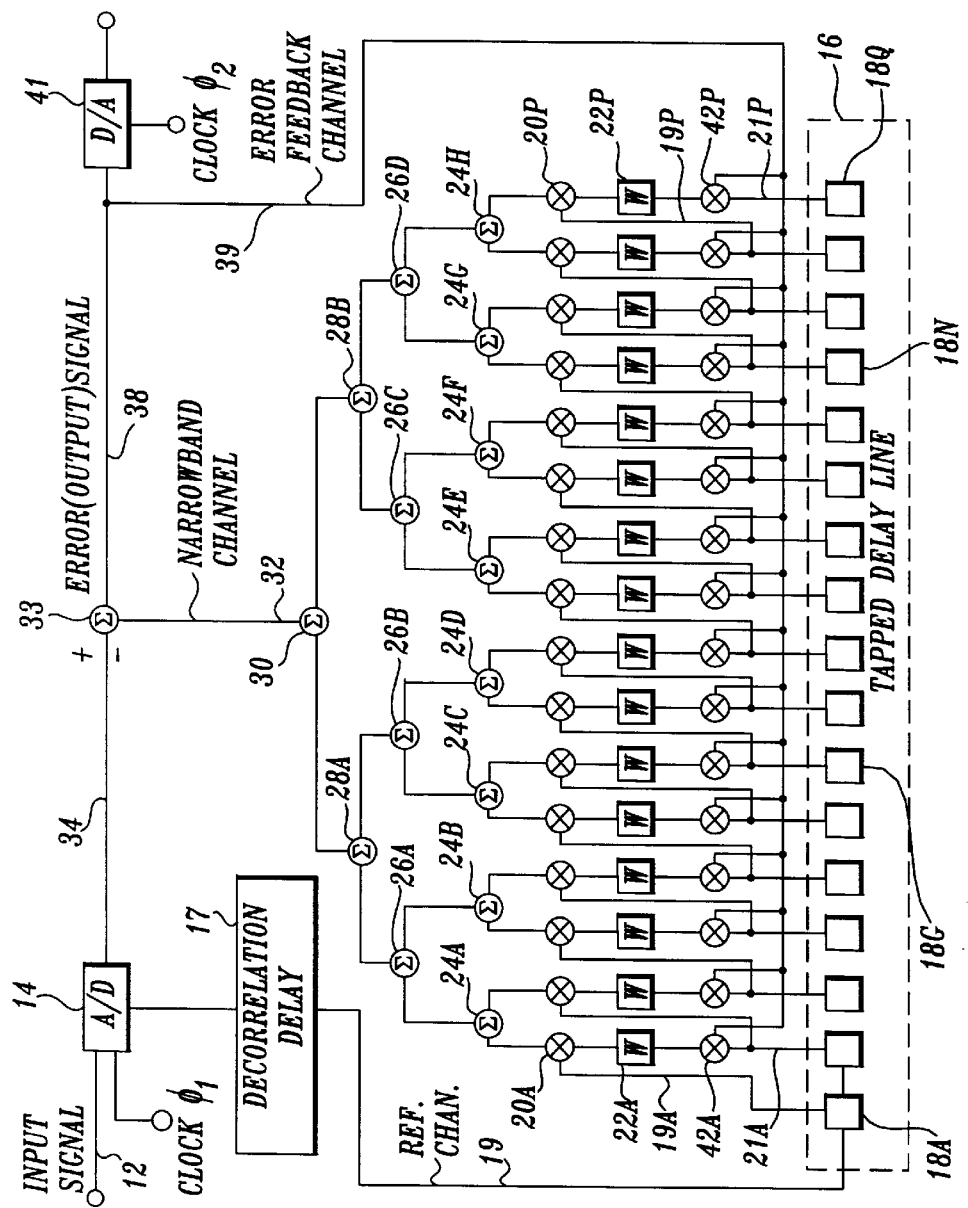
Figure 4:
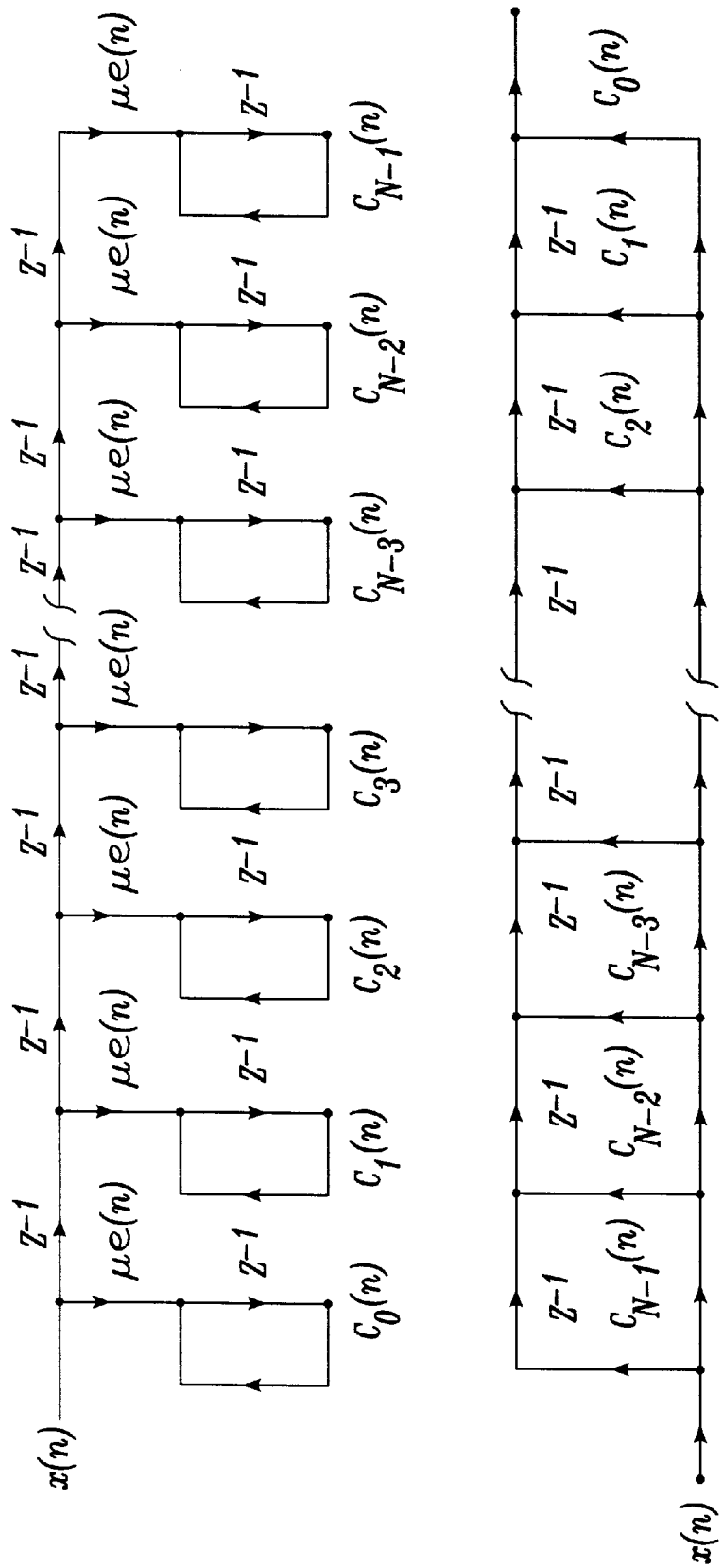
Figure 5:
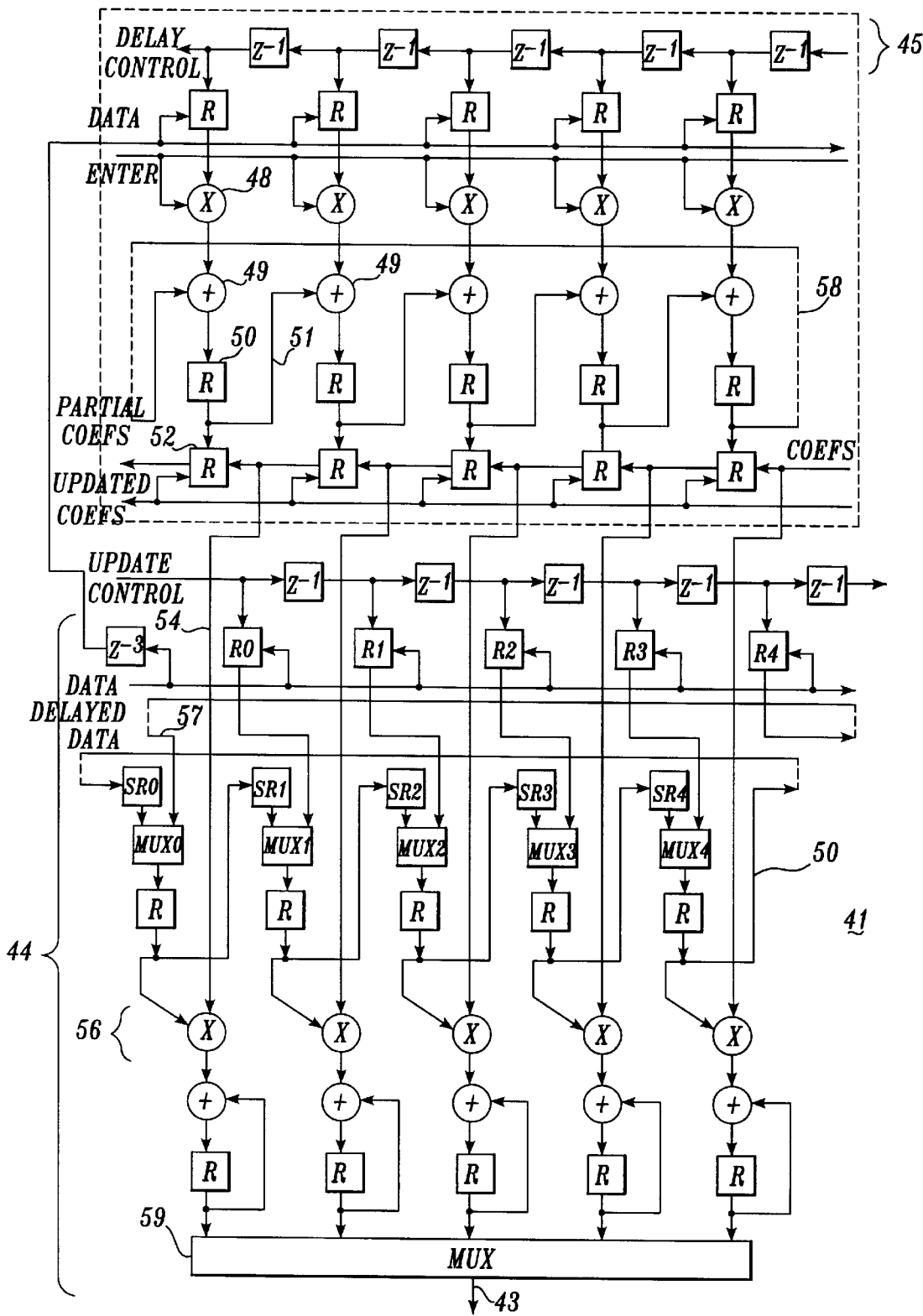
Figure 6:
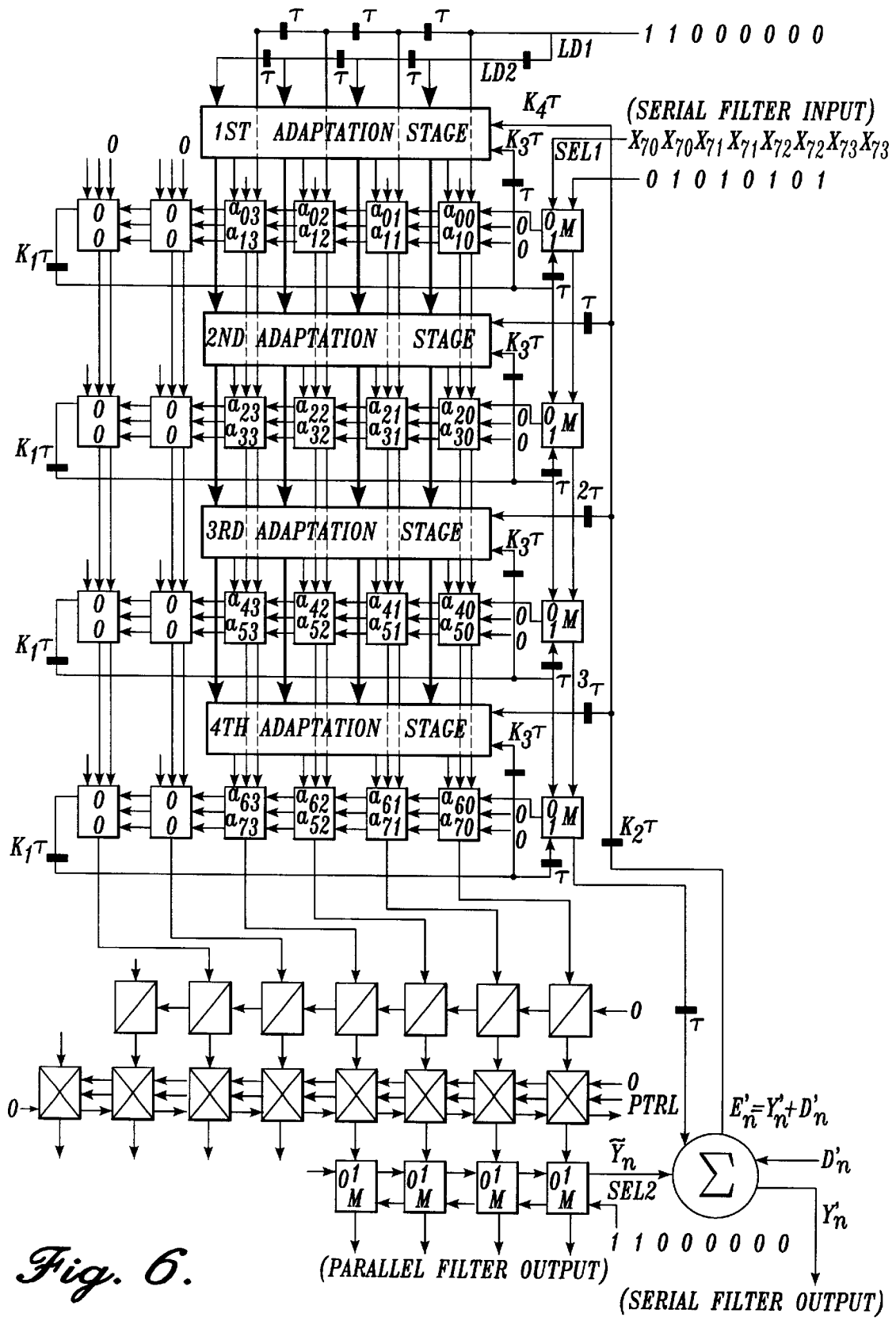
Figure 7:
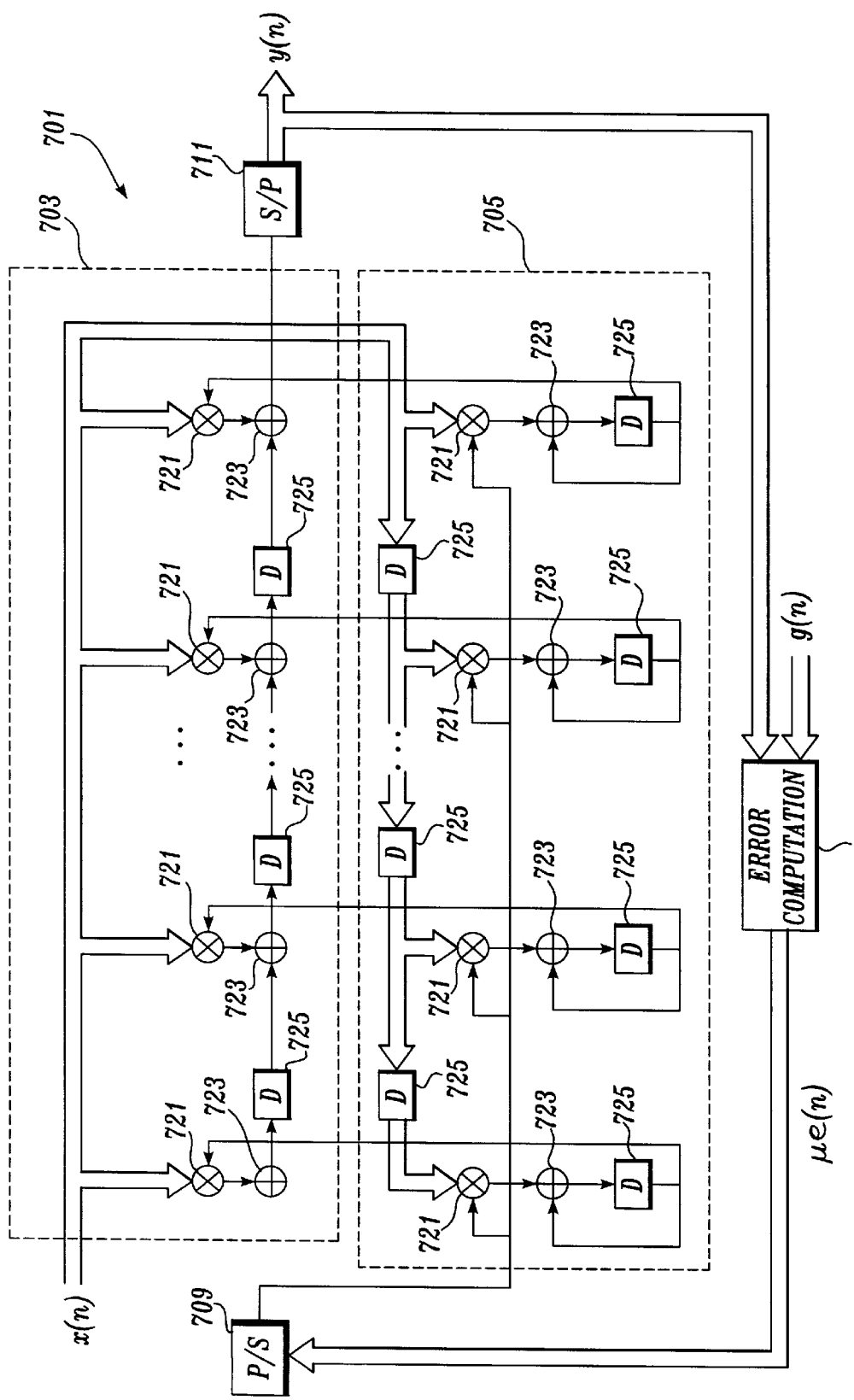
FIG. 7 illustrates in schematic format a parallel-serial real-valued modified LMS adaptive filter formed in accordance with the present invention.

Referring to FIG. 7, an architecture for implementing the real-valued modified LMS adaptive filter of above is shown. In FIG. 7, the wide lines indicate that the data is being transferred in parallel format. In contrast, the narrower lines indicate that the data is being transported in serial fashion. As seen in FIG. 7, the input signal x(n) is provided to the filter 701. Output signal y(n) is the output of the filter 701. In addition, the desired response signal g(n) and the error signal for updating the filter coefficients e(n) is as indicated on the FIGURE.

The filter 701 includes an FIR section 703 and an LMS adaptation section 705. Additionally, there is an error computation unit 707, a partial-to-serial converter 709, and a serial-to-parallel converter 711. The error computation unit 707 simply calculates the difference between g(n) and y(n) and multiplies the difference by the step factor $\mu$. The serial-to-parallel converter 711 and the parallel-to-serial converter 709 are known in the art. See for example *Digital Logic and Computer Design* by M. Morris Mano, 1979, Prentice-Hall, Inc.

The FIR section 703 includes a plurality of multipliers 721, adders 723 and delay elements 725. In the preferred embodiment, the delay elements 725 are D-flipflops. In addition, the adders 723 are carry save adders (described further below) that provide an output that is the sum of its two inputs. Multipliers 721, as will be further described below, are specialized parallel/serial multipliers. The LMS adaptation section 705 also includes multipliers 721, adders 723 and delay elements 725. These elements are identical to those found in the FIR section 703.

One important feature of the present invention is that the architecture shown in FIG. 7 uses a combination of parallel and digit-serial format and computational style. By parallel, it is meant the whole data word length, and by digit-serial, it is meant a short word length segment of the whole data word. The extreme case of a digit-serial is a single bit which results in a bit-level serial circuitry. However, it has been found that considering the trade-off between computational speed and hardware cost, and the using of sophisticated arithmetic circuitry, a preferred digit-serial size of two or four bits is preferred.

Figure 8:
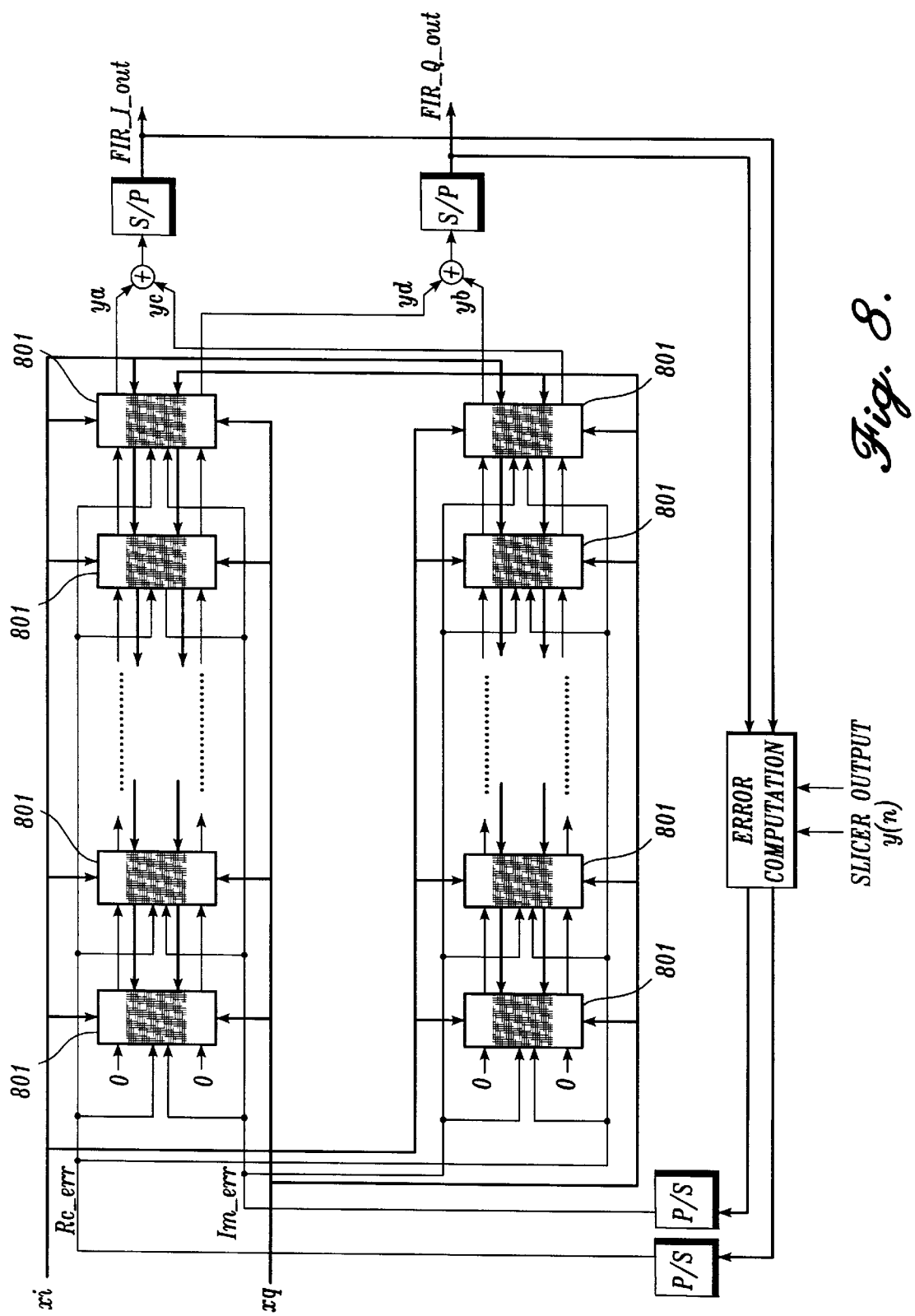
FIG. 8 illustrates in schematic format a parallel-serial complex-valued modified LMS adaptive filter formed in accordance with the present invention.

Turning to FIG. 8, an architecture for implementing the modified LMS algorithm for complex values is shown. FIG. 8 is substantially similar to FIG. 7 except that there are two parallel branches, each of which is equivalent to a double of the circuitry shown in FIG. 7. One branch is necessary for the real portion of the signals and one branch is necessary for the imaginary portions of the signals. In all other respects, the architectures are substantially identical. The equations representing the modified LMS algorithm in accordance with the present invention for complex values are as follows (where "r" denotes the real portion and "i" denotes the imaginary portion):

$$e_r(n)=g_r(n)-y_r(n)$$

$$e_i(n)=g_i(n)-y_i(n)$$

$$C_{kr}(n+1)=C_{kr}(n)+\mu[e_r(n)X_r(n-k)-e_i(n)X_i(n-k)]$$

$$C_{ki}(n+1)=C_{ki}(n)+\mu[e_r(n)X_i(n-k)+e_i(n)X_r(n-k)]$$

$$y_r(n) = \sum_{k=0}^{N-1} C_{kr}(n-k)X_r(n-k) - \sum_{k=0}^{N-1} C_{ki}(n-k)X_i(n-k)$$

$$y_i(n) = \sum_{k=0}^{N-1} C_{kr}(n-k)X_i(n-k) + \sum_{k=0}^{N-1} C_{ki}(n-k)X_r(n-k)$$

As seen from the above equations, there are a total of four sets of multiplications and summations to calculate the output signal y(n). Thus, FIG. 8 has two separate major branches, each major branch having two sub branches (total of four branches). The upper branch of FIG. 8 with an output of $y_a$ and $y_d$. The lower branch of FIG. 8 with an output of $y_b$ and $y_c$. The sum of $y_a$ and $y_c$ is the real portion of the output corresponding to $y_r(n)$ of the above equations. Note that the portion $y_c$ is subtracted from $y_a$ because the multiplication of two positive imaginary numbers yields a negative real number. The sum Of $y_b$ and $y_d$ is the imaginary portion of the output corresponding to $y_i(n)$ of the above equations. Thus, those skilled in the art that FIGURE is the architectural implementation of the complex modified LMS equations of the present invention.

Figure 9:
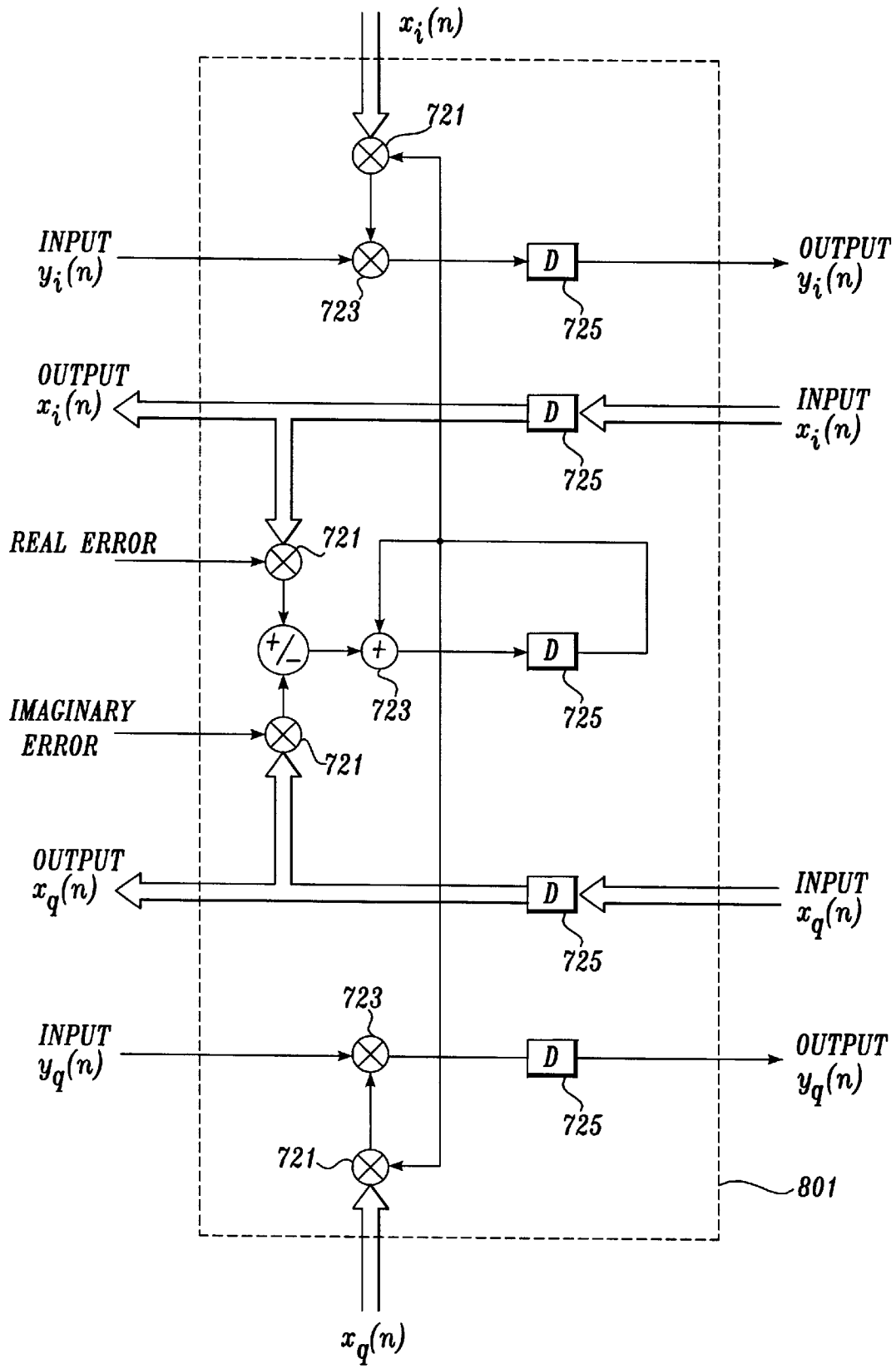
FIG. 9 illustrates the calculation block of the parallel-serial complex-valued adaptive filter shown in FIG. 8.

FIG. 9 shows a detailed arrangement of the calculation blocks 801 shown in FIG. 8. As can be seen, this calculation block 801 is comprised of multipliers 721, adders 723, and delay units 725. The calculation block 801 contains two real-valued FIR taps and a real-coefficient updating scheme. The real-coefficient updating circuitry performs an inner product of two two-dimensional vectors, thus two such composing cells construct a complex-valued tap. Those skilled in the art will note that this hardware partition is efficient for VLSI implementation, because of its regularity and modularity, and the localized data interconnection. In addition, as seen in FIG. 8, two additional adders are required to sum up four partial results to form the filter output (the real portion and the imaginary portion). Further, additional serial-to-parallel devices are necessary to accommodate complex values.

One of the critical components that allows the present invention to operate are the multipliers 721 and adders 723. Shown in FIG. 10 in block format is the preferred embodiment of the multipliers 721 and accumulator 723. As seen, two operands are provided to the multiplier 721. The "multiplicand" is in parallel format and the "multiplier" is presented in digit-serial format. Therefore, in order to complete a multiplication operation between two words, several partial multiplications are performed until enough digit-serial data is provided to complete a word. Therefore, several subclock cycles are required within a clock cycle to transmit and multiply the complete multiplier word. During each clock cycle, a partial product is calculated by multiplying the multiplicand and the incoming multiplier digit. The details in the operation depend upon the arithmetic recoding applied to the multiplier. One popular method of recoding is Booth's algorithm or a modified Booth's algorithm.

Figure 10:
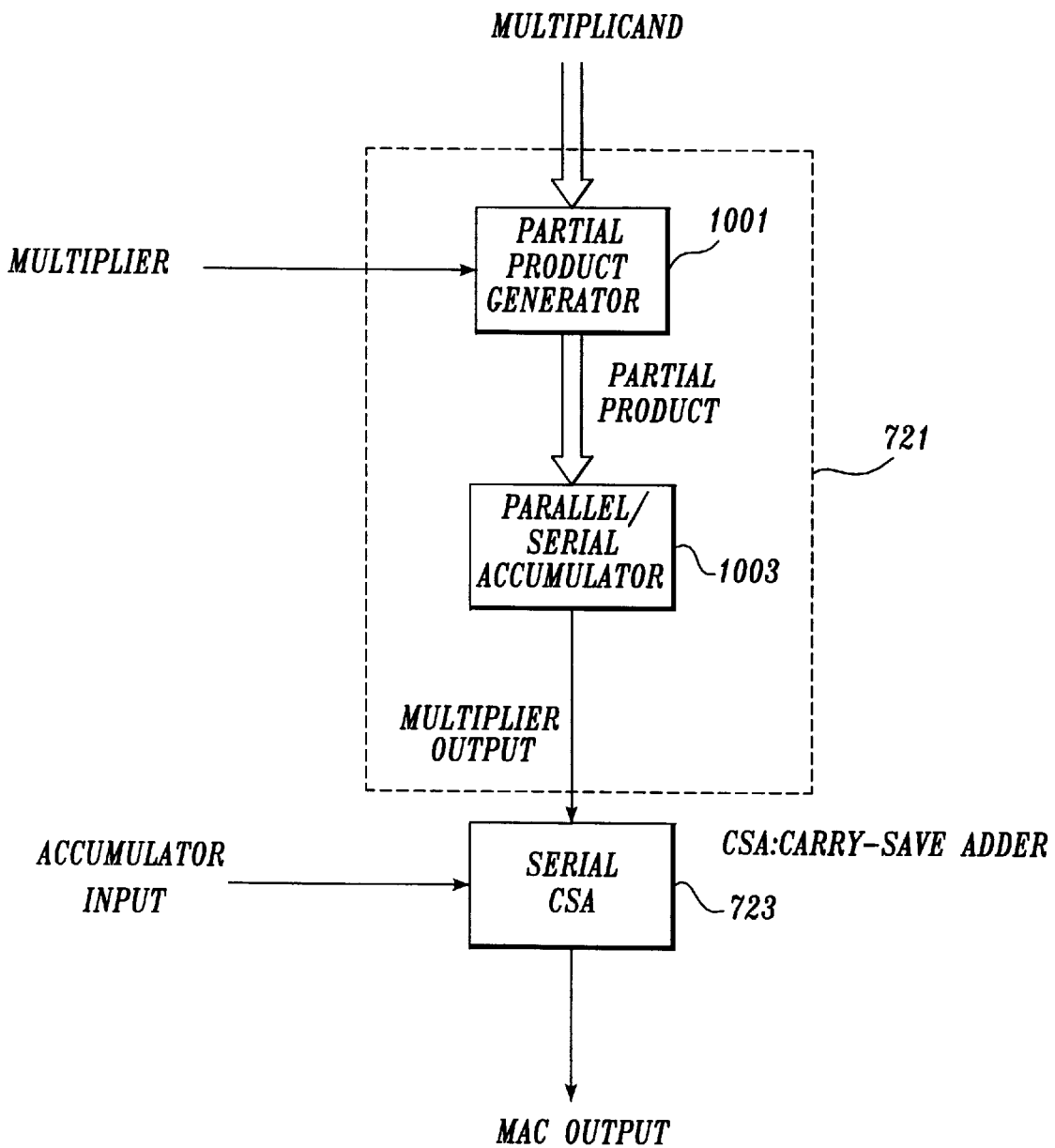
FIG. 10 illustrates in schematic format a parallel-serial pipelined multiplier-and-accumulator formed in accordance with the present invention.

Turning to FIG. 10, it can be seen that the multiplicand and the multiplier are input into a partial product generator 1001. The partial product generator produces a partial product that is input into a parallel/serial accumulator 1003. The output of the parallel/serial accumulator 1003 is then input into a serial carry save adder 723. This carry save adder 723 corresponds to the carry save adder 723 shown in FIGS. 7 and 9.

Figure 11:
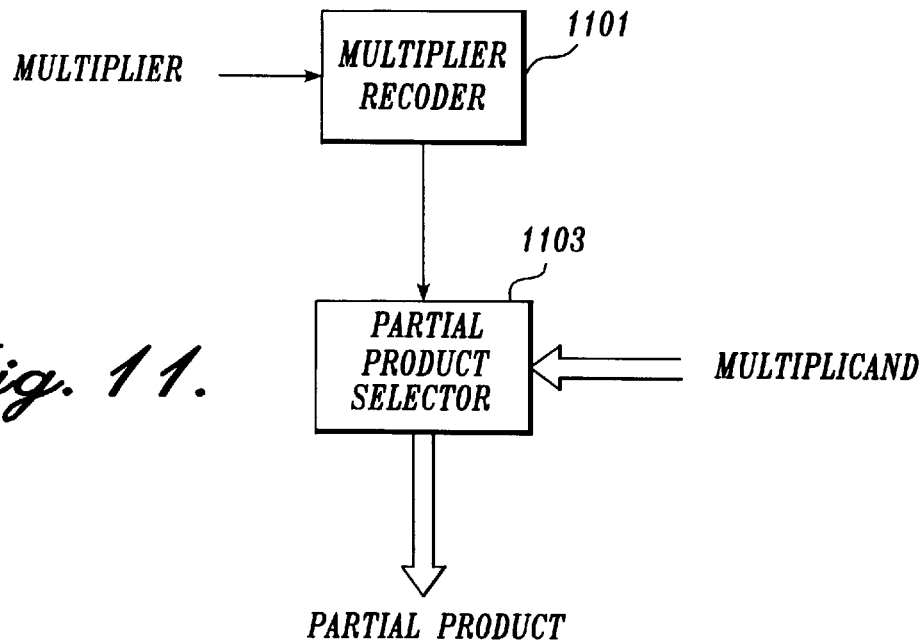
FIG. 11 illustrates the partial product generator of FIG. 10.

The partial product generator 1001 is shown in further detail in FIG. 11. As seen, the partial product generator 1001 includes a recoder 1101 and a partial product selector 1103. The recoder 1101 recodes the multiplier using a recoding algorithm, for example, Booth's recoding algorithm, modified Booth's recoding, or any one of a number of other recoding algorithms. Booth's recoding is well known in the art and is exemplified in U.S. Pat. No. 5,574,672 to Briggs, 4,817,092 to Finegold, U.S. Pat. No. 5,638,313 to Chu, and U.S. Pat. No. 5,001,661 to Corleto et al.

In this preferred embodiment, the output of the recoder is a three bit output that is used to select the partial product from a preset number of multiples of the multiplicand. Thus, in this example, a 16 bit multiplier is input into the modified Booth recoder. The output of the recoder is a 3 bit word (even though only 2 bits of the 16 bit multiplier are processed each cycle). The 3 bit word is used by the partial product selector 1103 to output a predetermined 17 bit partial product. The partial product is then provided to the accumulator 1003 which adds up the partial products (eight in all for a 16 bit multiplier). Note that the accumulator 1003 in the present invention only needs to accommodate 17 bits. In the prior art, a 32 bit adder would have been required to perform a multiplication of two 16 bit words.

The accumulator 1003 outputs two bits during each sub-cycle of the multiplication to the adder 723. The two bits that are output are the least significant bits for that multiplication. As each sub-cycle is performed, 2 bits are output to provide the 16 least significant bits of the final answer to the multiplication. The 16 MSBs are provided by the accumulator after all of the partial products have been added. Later as seen below, a "merger" by means of a multiplexer is used to combine the 16 LSBs with the 16 MSBs.

Figure 12:
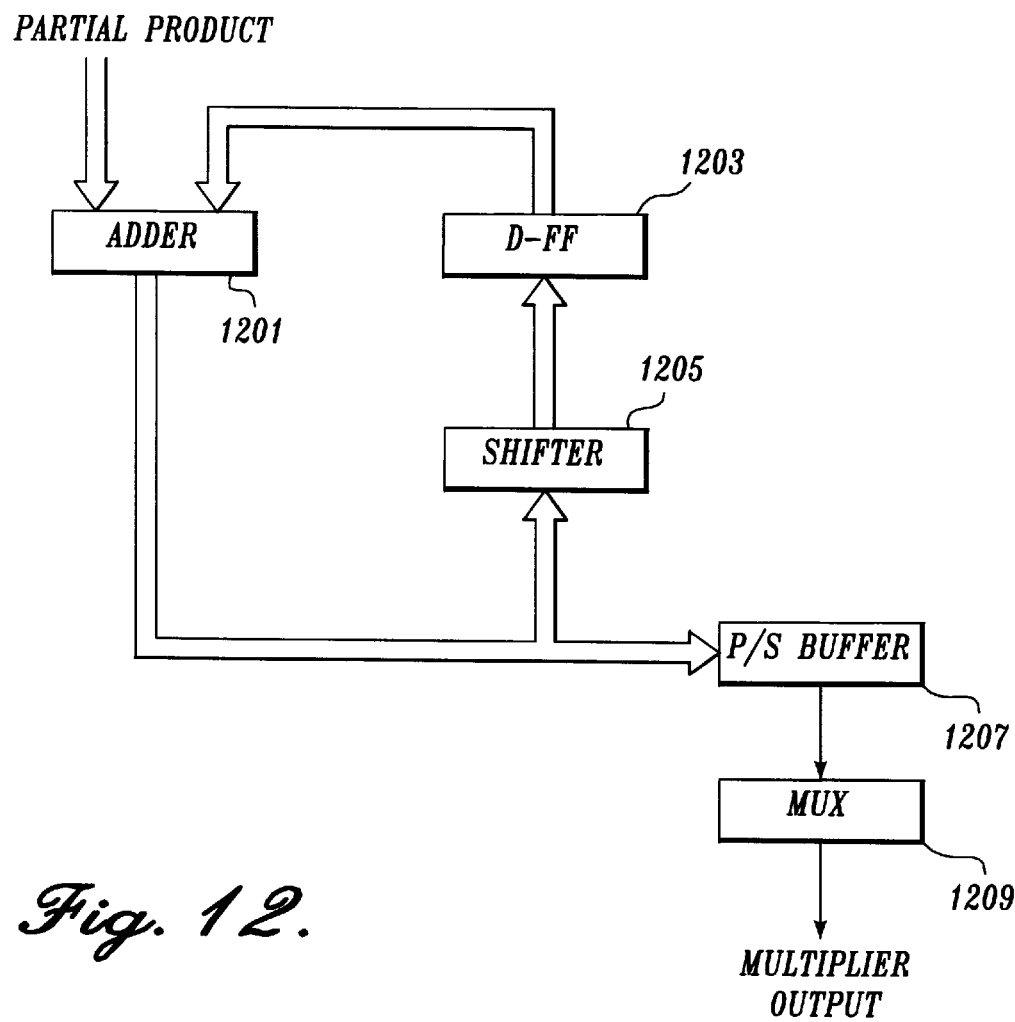
FIG. 12 illustrates the partial/serial accumulator of FIG. 10.

The parallel/serial accumulator 1003 is shown in further detail in FIG. 12. The accumulator 1003 includes an adder 1201, a D-flipflop 1203, a shifter 1205, a parallel-to-serial buffer 1207, and a multiplexer 1209. In operation, the partial product that is output by the partial product generator 1001 is provided to the adder 1201. The adder also receives as an input the output of the D-flipflop 1203. The adder sums the two inputs together and provides an output to the shifter 1205 and the parallel/serial buffer 1207. The shifter then shifts the output of the adder 1201 and provides the shifted output to D-flip-flop 1203. The shifter also provides a serial output to the multiplexer 1209. The parallel/serial buffer 1207 buffers the parallel data and outputs a serial output to the multiplexer 1209.

Figure 13:
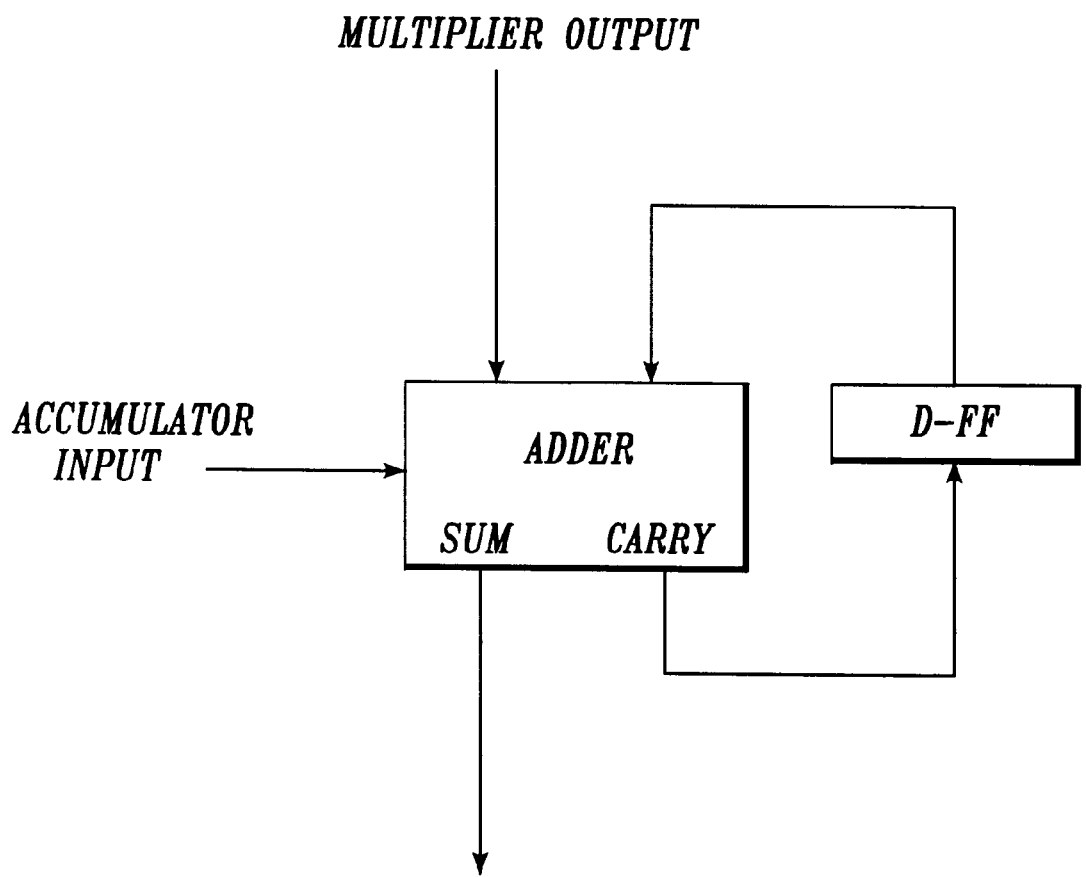
FIG. 13 illustrates the carry-save adder of FIG. 10.

FIG. 13 illustrates in greater detail of the carry save adder 723 of FIG. 10. As seen, the adder 723 is comprised of an adder and a D-flipflop. The accumulator input is the input from the previous stage of multiplication. For example, in FIG. 7, each of the adders 723 include an input from the previous stage of multiplication.

Figure 14:
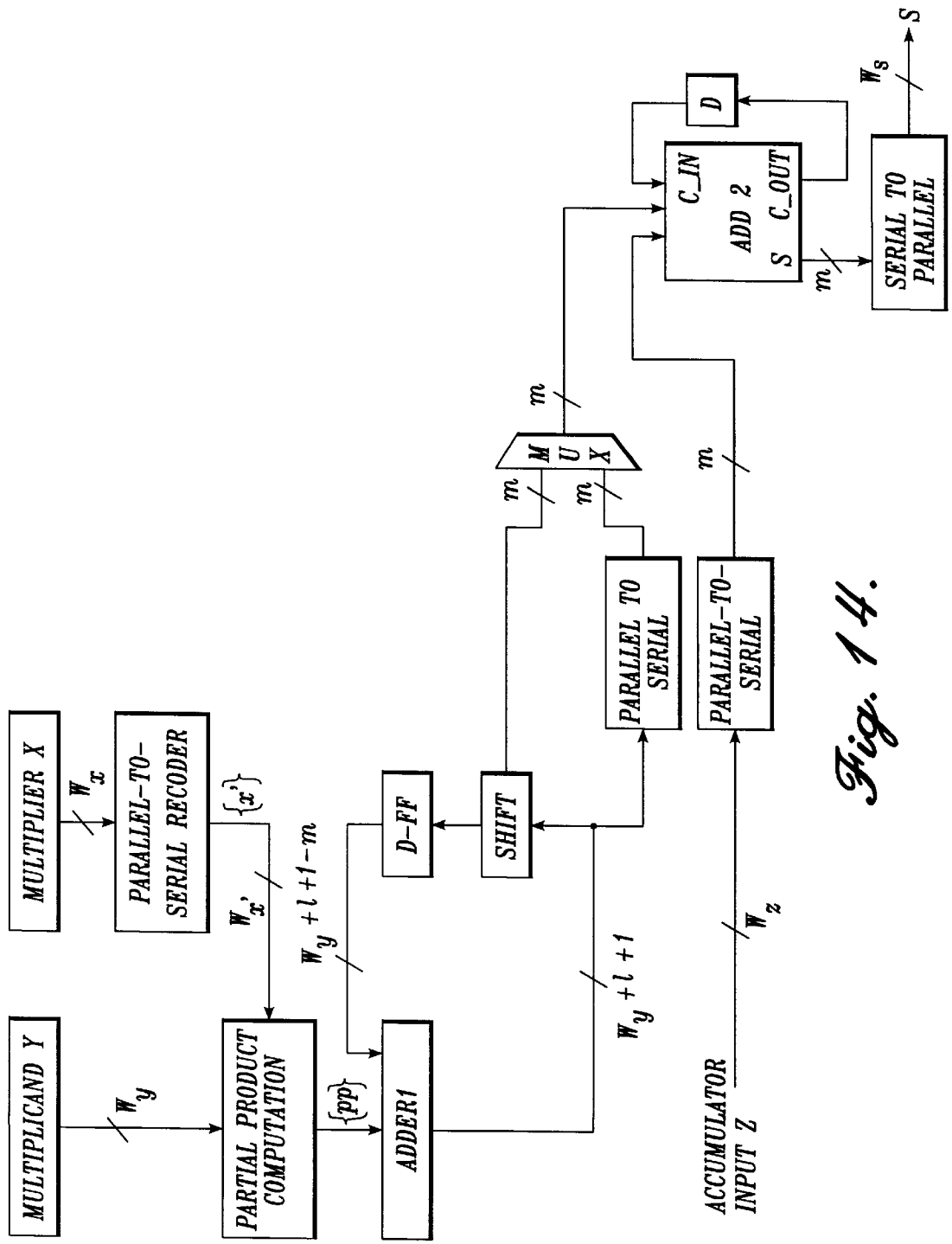
FIG. 14 illustrates the entire multiplier/accumulator architecture of the present invention.

FIG. 14 illustrates the entire architecture of the multiplier and adder of the present invention. As seen, a multiplicand Y and a multiplier X are input into the apparatus. In this case, the multiplicand Y has a word length of $W_y$ and the multiplier has a word length of $W_x$. The multiplier X is provided to the recoder that outputs a word of bit-length $W_x'$. The recoded word $W_x'$ and the multiplicand are provided to the partial product generator and a partial product {pp} is output. This partial product is provided to that adder1. The shifter and the D-flip flop are used to shift the partial products so that the output of the adder1 are the least significant bits of the adder1. After several clock cycles, one-half of the final product is provided to the multiplexer through the shifter. These are the least significant bits. The most significant bits are output by the adder1 after the eight clock cycles through the parallel to serial converter to the multiplexer. The multiplexer combines the most significant bits and the least significant bits to form the final product (which has a word length of $W_y+W_x$).

This final product is provided to the carry save adder (add2) which adds the product to another accumulated input z from a previous stage. Finally, the total accumulated sum is output in parallel format by the serial to parallel converter.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. An improved parallel-serial multiplier and accumulator for multiplying a digital multiplicand having a word length of Y and a multiplier having a word length of X to provide a product that is added to an accumulator input, said parallel-serial multiplier and accumulator comprising:

a parallel-serial multiplier comprising:

(a) a recoder for receiving said digital multiplier and outputting an ordered sequence of recoded words;

(b) a partial product generator for generating a plurality of partial products that are dependent upon said digital multiplicand and each of said ordered sequence of recoded words; and (c) an adder for adding said plurality of partial products to provide said product, wherein the adder outputs a digit serial word that contains the least significant bits of intermediate sums of the partial products as the partial products are being added; and a digit serial adder, said digit adder comprising a carry save adder that receives said product and said accumulator input to produce an output that is the sum of said product and said accumulator input.

2. The parallel-serial multiplier and accumulator of claim 1 further wherein said parallel-serial multiplier further includes a shift register and a D flip-flop connected in series to said adder for summing said partial products.

3. The parallel-serial multiplier and accumulator of claim 2 further including a multiplexer for selecting a multiplier output based on said least significant bits and said most significant bits output from said adder after all of the partial products have been summed.

4. The parallel-serial multiplier and accumulator of claim 1 further including a parallel to serial converter for converting said accumulator input into digit serial format and providing said accumulator input in digit serial format to said digit serial adder.

5. The parallel-serial multiplier and accumulator of claim 4 further including a serial to parallel converter for converting said output into parallel format.

6. The parallel-serial multiplier and accumulator of claim 1 further including a multiplexer for selecting a multiplier output based on said least significant bits and said most significant bits output from said adder after all of the partial products have been summed.

* * * * *

UNITED STATES PATENT AND TRADEMARK OFFICE
CERTIFICATE OF CORRECTION

PATENT NO. : 6,035,319
DATED : March 7, 2000
INVENTOR(S) : H.-M. Jong et al.

It is certified that error appears in the above-identified patent and that said Letters Patent is hereby corrected as shown below:

| COLUMN | LINE | ERROR |
|---|---|---|
| [56] Pg. 1, col. 1 | Refs. Cited (U.S. Pats., Item 7) | "Grazsi" should read --Gazsi-- |

Signed and Sealed this

Fifth Day of June, 2001

Attest:

*Attesting Officer*

NICHOLAS P. GODICI
*Acting Director of the United States Patent and Trademark Office*